(12) United States Patent
Yanagisawa

(10) Patent No.: US 7,554,210 B2
(45) Date of Patent: Jun. 30, 2009

(54) SEMICONDUCTOR DEVICE WITH SEMICONDUCTOR CHIP MOUNTED IN PACKAGE

(75) Inventor: Satoshi Yanagisawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 294 days.

(21) Appl. No.: 11/402,513

(22) Filed: Apr. 11, 2006

(65) Prior Publication Data

US 2006/0186516 A1  Aug. 24, 2006

Related U.S. Application Data

(62) Division of application No. 10/643,717, filed on Aug. 19, 2003, now abandoned.

(30) Foreign Application Priority Data

Sep. 5, 2002  (JP) .............................. 2002-259601

(51) Int. Cl.
  *H01L 23/495* (2006.01)
(52) U.S. Cl. ...................... 257/796; 257/676
(58) Field of Classification Search ................. 257/797, 257/796, 676, 696, E23.047
  See application file for complete search history.

(56) References Cited

U.S. PATENT DOCUMENTS

| | | | |
|---|---|---|---|
| 5,434,449 A * | 7/1995 | Himeno et al. | 257/690 |
| 5,521,429 A | 5/1996 | Aono et al. | 257/676 |
| 6,040,626 A | 3/2000 | Cheah et al. | |
| 6,249,041 B1 | 6/2001 | Kasem et al. | |
| 6,396,127 B1 | 5/2002 | Munoz et al. | |
| 6,469,398 B1 | 10/2002 | Hori | 257/796 |
| 6,566,164 B1 * | 5/2003 | Glenn et al. | 438/107 |

FOREIGN PATENT DOCUMENTS

| | | |
|---|---|---|
| JP | 11354702 | 12/1999 |
| JP | 2001-358259 | 12/2001 |
| JP | 2002-314018 | 10/2002 |
| JP | 2002329828 | 11/2002 |

OTHER PUBLICATIONS

"Notification of Reasons for Rejection"—JPO Search Report listing cited references.

* cited by examiner

*Primary Examiner*—Leonardo Andújar
(74) *Attorney, Agent, or Firm*—Hogan & Hartson LLP

(57) ABSTRACT

A semiconductor device including a semiconductor chip having first and second principal surfaces is disclosed. The semiconductor chip includes a first electrode formed on the first principal surface and a second electrode formed on the second principal surface. A first lead frame includes a first connecting portion connected to the first electrode and a first terminal portion. A second lead frame includes a second connecting portion connected to the second electrode and a second terminal portion. The semiconductor chip is sealed by a housing. The housing is formed so as not to cover part of surfaces of the first and second connecting portions.

17 Claims, 11 Drawing Sheets

SEMICONDUCTOR DEVICE WITH SEMICONDUCTOR CHIP MOUNTED IN PACKAGE

CROSS-REFERENCE TO RELATED APPLICATIONS

This application is a divisional of U.S. application Ser. No. 10/643,717, filed on Aug. 19, 2003, now abandoned which is based upon and claims the benefit of priority from the prior Japanese Patent Application No. 2002-259601, filed on Sep. 5, 2002, the entire contents of which applications are incorporated herein by reference.

BACKGROUND OF THE INVENTION

1. Field of the Invention

The present invention relates to a semiconductor device with a semiconductor chip including a semiconductor element, which is mounted in a package.

2. Description of the Related Art

In recent years, for power devices such as a device having a vertical MOSFET, miniaturization is required, and it is strongly desired to reduce electric resistance such as on-resistance. Along with an increase in capacity, it is necessary to reduce thermal resistance and efficiently release heat generated from chips to the outside.

A semiconductor device having this type of power device is generally structured as follows. A power element is formed in a semiconductor chip. The semiconductor chip includes first and second principal surfaces, on which electrodes are provided respectively. These electrodes are connected to lead frames. The semiconductor chip is disposed and sealed in a housing of resin.

In a semiconductor device described in U.S. Pat. No. 6,040,626, a gate electrode formed on the first principal surface of the semiconductor chip is connected to a first lead frame through a gate wire. A source electrode disposed on the first principal surface of the semiconductor chip is connected to a second lead frame through a top plate portion. A drain electrode disposed on the second principal surface of the semiconductor chip is connected to a third lead frame through a bottom plate portion. Such a top plate portion realizes reduction of on-resistance. The semiconductor chip, the gate wire, and part of the first to third lead frames are sealed in the housing.

In the above described semiconductor device, the source electrode, through which a large amount of current needs to flow, is connected to the top plate portion of the lead frame. Therefore, since a current path from the source electrode to the lead frame has a large cross-sectional area, the electric resistance can be reduced. However, as the plate is sealed with the resin forming the housing, heat generated from the semiconductor chip cannot be released when a particularly large amount of current is flown. Thus, illegal operations of the element, deformation, short-circuit, and the like may be caused by heat.

On the other hand, in a semiconductor device described in Japanese Patent Publication (Kokai) No. 2001-358259, a heat sink is provided on a semiconductor chip. The semiconductor chip is sealed in a housing. A source electrode disposed on a first principal surface of the semiconductor chip is connected to a first lead frame through a plurality of source wires. The gate electrode disposed on the first principal surface of the semiconductor chip is connected to a third lead frame through a single or a plurality of gate wires. A drain electrode disposed on the second principal surface of the semiconductor chip is connected to a second lead frame. Moreover, on the first principal surface of the semiconductor chip, the heat sink is provided. The heat sink has a surface exposed to the outside of the housing, so that the heat sink can release heat to the outside of the housing.

In the semiconductor device described in the Japanese Patent Publication (Kokai) No. 2001-358259, a heat sink is formed on the first principal surface of a semiconductor chip. Accordingly, heat generated from the semiconductor chip can be released. However a source electrode, through which a particularly large amount of current needs to flow, is connected to a lead frame by the plurality of wires. Therefore, a cross-sectional area of a current path from the source electrode to the lead frame is small, so that the electric resistance increases.

BRIEF SUMMARY OF THE INVENTION

An aspect of a semiconductor device according to the present invention includes:

a semiconductor chip including first and second principal surfaces, a first electrode formed on the first principal surface, and a second electrode formed on the second principal surface;

a first lead frame including a first heat sink portion connected to the first electrode and a first terminal portion;

a second lead frame including a second heat sink portion connected to the second electrode and a second terminal portion; and a housing sealing the semiconductor chip and being formed not to cover part of surfaces of the first and second heat sink portions.

DETAILED DESCRIPTION OF THE INVENTION

Hereinafter, a detailed description will be given of embodiments of the present invention with reference to the drawings.

Figure 1:
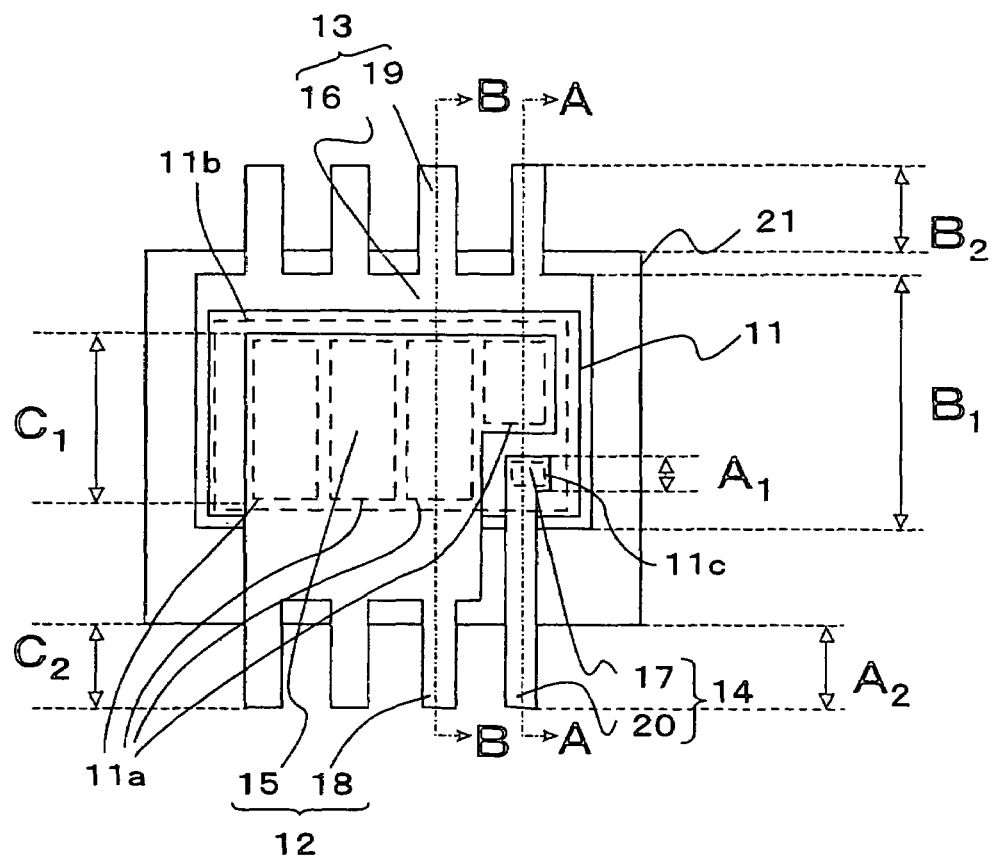
FIG. 1 is a plan view showing a semiconductor device according to a first embodiment of the present invention.
Figure 2:
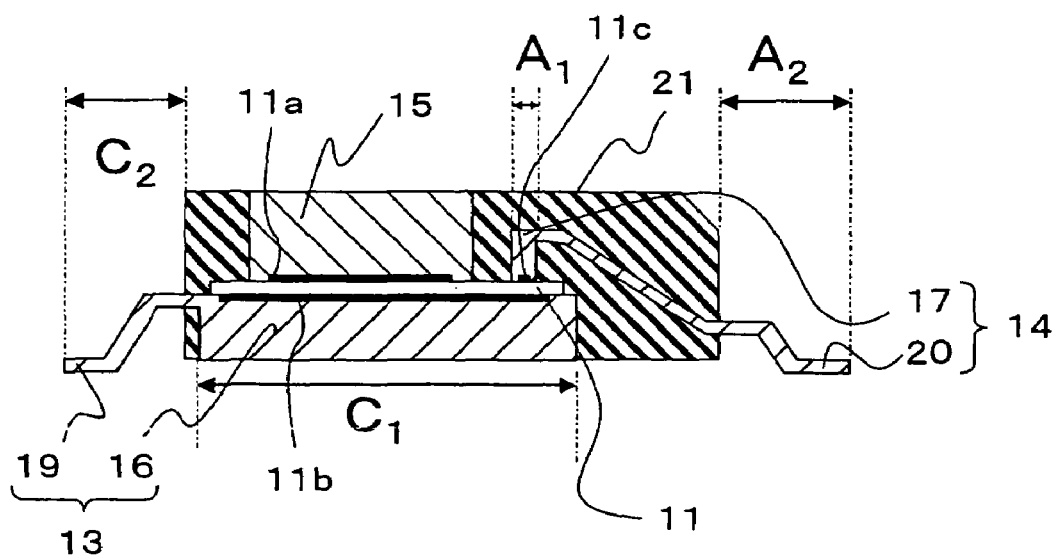
FIG. 2 is a cross-sectional view of the semiconductor device of FIG. 1 taken along a line A-A.
Figure 3:
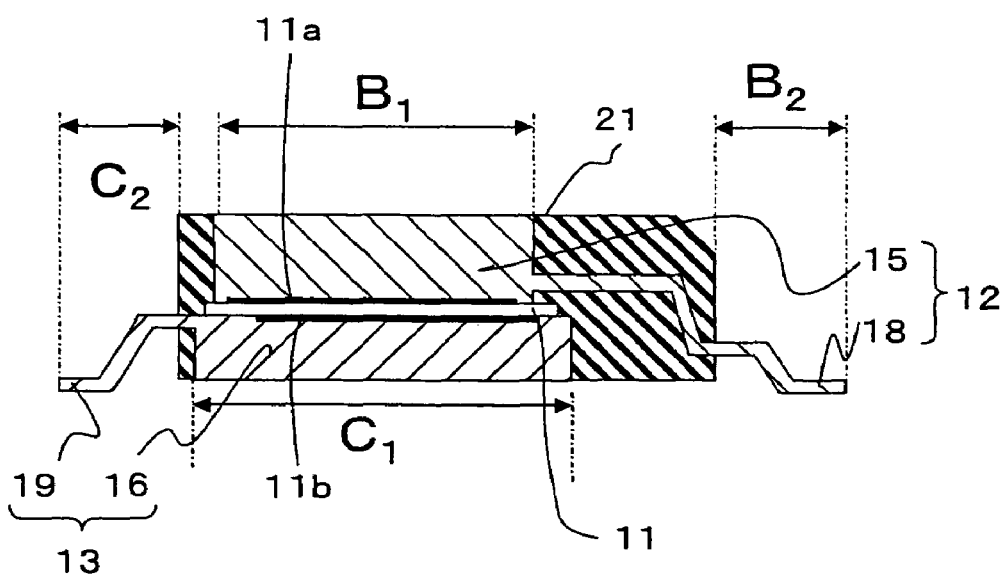
FIG. 3 is a cross-sectional view of the semiconductor device of FIG. 1 taken along a line B-B.

FIGS. 1 to 3 show a semiconductor device according to a first embodiment of the present invention.

FIG. 1 is a plan view of the semiconductor device. FIG. 2 is a cross-sectional view of the semiconductor device shown in FIG. 1 taken along a line A-A. FIG. 3 is a cross-sectional view of the semiconductor device shown in FIG. 1 taken along a line B-B.

A source electrode 11a and a gate electrode 11c are disposed on a first principal surface of a semiconductor chip 11, respectively. The source electrode 11a and the gate electrode 11c are connected to first and third lead frames 12 and 14, respectively. A drain electrode 11b, which is disposed on a second principal surface of the semiconductor chip 11, is connected to a second lead frame 13. The first and second lead frames 12 and 13 include first and second heat sink portions 15 and 16, respectively. The third lead frame 14 includes a top plate portion 17. The first to third lead frames 12, 13, and 14 include first to third terminal portions 18, 19, and 20, respectively. In the semiconductor chip 11, for example, a vertical MOSFET is formed.

As shown in FIG. 2, the top plate portion 17, which is a substantially board-shaped conductive plate, is connected to the gate electrode 11c. The gate electrode 11c is disposed on the first principal surface of the semiconductor chip 11. The top plate portion 17 occupies one end portion ($A_1$) of the third lead frame 14. The third terminal portion 20 occupies the other end portion ($A_2$) of the third lead frame 14. The top plate portion 17 and the third terminal portion 20, which constitute the third lead frame 14, are unified. The third lead frame 14 is composed of a conductive material containing, for example, Cu in consideration of moderate hardness, resistance, a price, and the like.

The second heat sink portion 16 is connected to the drain electrode 11b, which is disposed on the second principal surface of the semiconductor chip 11. In the second heat sink portion 16, part of a surface is not covered with the housing. The second heat sink portion 16 occupies one end portion ($C_1$) of the second lead frame 13. The second terminal portion 19 occupies the other end portion ($C_2$) of the second lead frame 13. The second heat sink portion 16 and the second terminal portion 19, which constitute the second lead frame 13, are unified. The second lead frame 13 is composed of a conductive material containing, for example, Cu, in consideration of moderate hardness resistance, a price, and the like.

As shown in FIG. 3, the first heat sink portion 15 is connected to the source electrode 11a, which is disposed on the first principal surface of the semiconductor chip 11. The first heat sink portion 15 serves as the top plate portion which is a substantially board-shaped conductive plate. In the first heat sink portion 15, part of a surface is not covered with the housing. The first heat sink portion 15 occupies one end portion ($B_1$) of the first lead frame 12. The first terminal portion 18 occupies the other end portion ($B_2$) of the first lead frame 12. The first sink portion 15 and the first terminal portion 18, which constitute the first lead frame 12, are unified. The first lead frame 12 is composed of a conductive material containing, for example, Cu in consideration of moderate hardness, resistance, a price, and the like. Hereinafter, such a structure that the source electrode is connected to the lead frame through the substantially board-shaped conductive plate formed on the source electrode is referred to as "a strap".

In order to have sufficient heat sink effect, the first and second heat sink portions 15 and 16 are thicker than the first and second terminal portions 18 and 19. The semiconductor chip 11 is directly sandwiched between the first heat sink portion 15 and the second heat sink portion 16. The first and second heat sink portions 15 and 16 are brought in direct contact with and press-contacted to the source electrode 11a and the drain electrode 11b, respectively. A housing 21 is formed around the first heat sink portion 15 connected to the semiconductor chip 11 such that an upper surface of the first heat sink portion 15 is exposed. The housing is formed around the second heat sink portion 16 as well such that a lower surface of the second heat sink portion 16 is exposed. The housing 21 seals the semiconductor chip and the like by using resin or the like. The first to third lead frames 12, 13, and 14 are fixed to the housing 21 by expansion force (or shrinkage force) of the resin.

As shown in FIG. 2, the top plate portion 17, which is connected to the gate electrode 11c and serves as the strap, is covered with resin or the like and insulated from the first heat sink portion 15.

According to the first embodiment, the upper surface of the first heat sink portion 15 and the lower surface of the second heat sink portion 16 are not covered with resin of the housing and exposed to the outside of the housing. Accordingly, heat generated from the semiconductor chip 11 can be directly released to the outside of the housing. Therefore, the first heat sink portion 15, which is formed on the source electrode 11a, has a structure serving as the strap and can efficiently release the heat from the semiconductor chip to the outside. As a result, thermal resistance and electric resistance can be reduced. Moreover, since the top plate portion 17 is formed on the gate electrode 11c as the conductive plate with the strap structure, the electric resistance can be further reduced.

Since heat can be released from both the upper surface of the first heat sink portion 15 and the lower surface of the second heat sink portion 16, namely, from each principal surface side, good heat release efficiency is provided. Therefore, deformation of the semiconductor chip, such as warpage, due to a temperature difference between each principal surface side can be suppressed. Moreover, an operating range of the semiconductor device can be extended. Surface areas of the heat sink portions exposed to the outside can be used as part of terminals.

Next, a description will be given of modifications of the above-described first embodiment of the present invention. In FIGS. 4 to 8 showing these modifications, the same portions to those of the first embodiment are given the same numbers.

Figure 4:
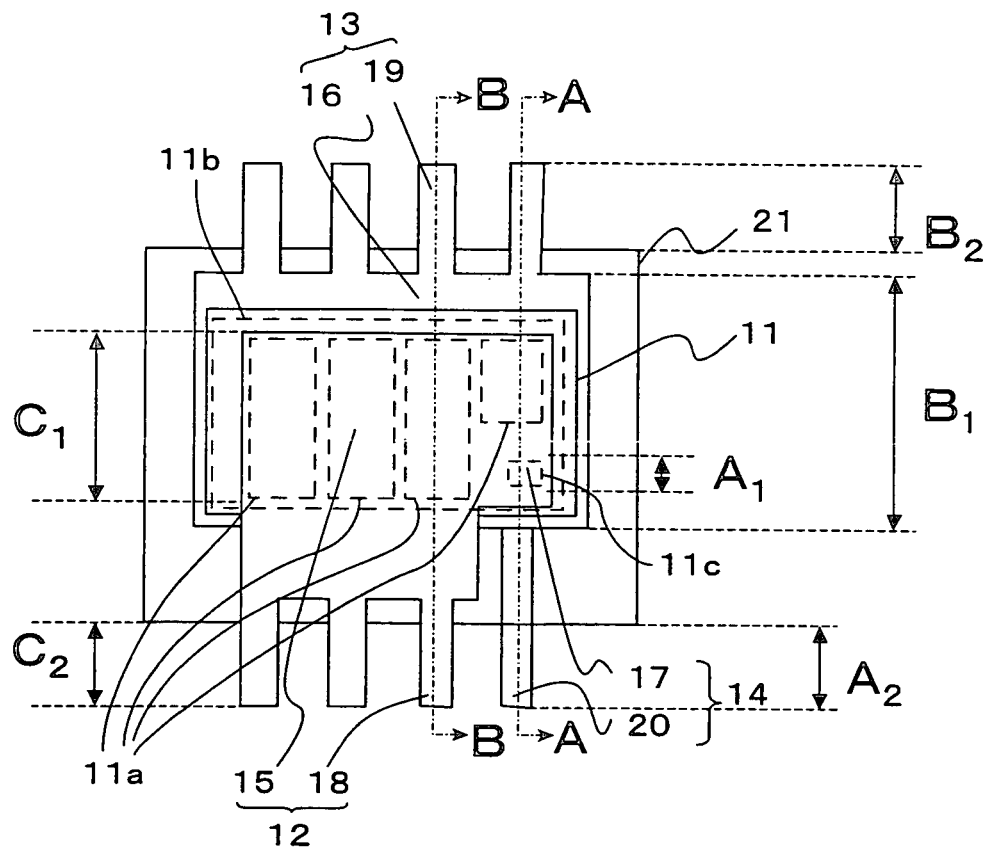
FIG. 4 is a plan view showing a semiconductor device according to a first modification of the first embodiment of the present invention.
Figure 5:
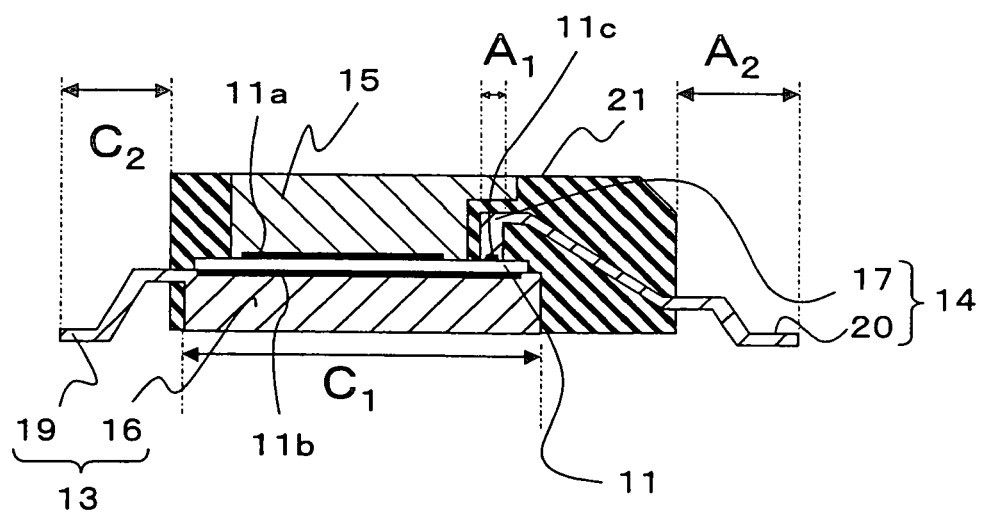
FIG. 5 is a cross-sectional view of the semiconductor device of FIG. 4 taken along a line A-A.

FIGS. 4 and 5 show the first modification. In this modification, the first heat sink portion 15 is extended over the top plate portion 17, and the first heat sink portion 15 is formed above the top plate portion 17 with a sealing material (the housing 21) such as resin interposed therebetween. Since the first heat sink portion 15 is formed in such a manner, an area of a heat sink region can be enlarged, so that the thermal resistance can be further reduced.

Figure 6:
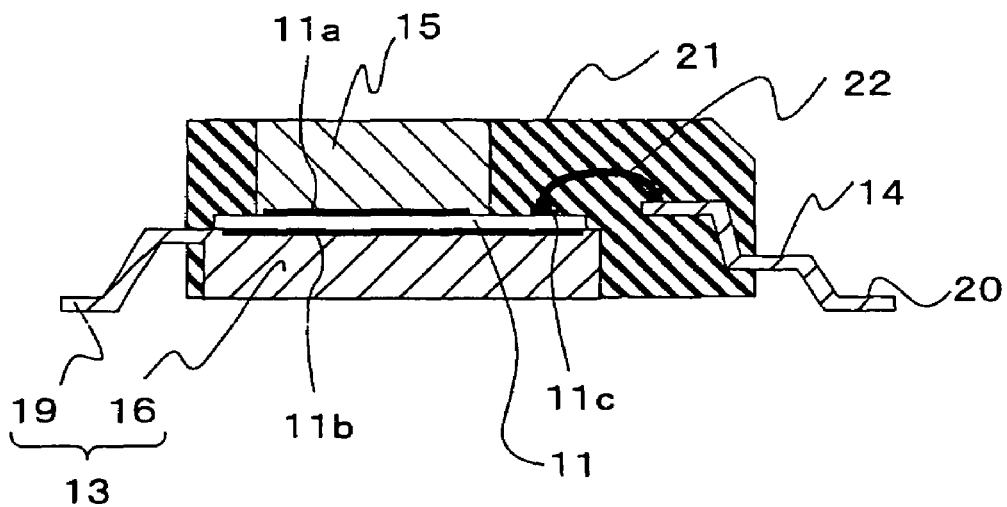
FIG. 6 is a cross-sectional view of a semiconductor device according to a second modification of the first embodiment of the present invention.

FIG. 6 shows the second modification. In this modification, instead of the top plate portion 17 of FIG. 2, a gate wire 22 is connected by bonding on the gate electrode 11c, which is disposed on the first principal surface of the semiconductor chip 11. The gate electrode 11c is connected to the third terminal portion 20 of the third lead frame 14 through this gate wire 22. The gate wire 22 can be composed of, for example, gold. The third lead frame 14 is composed of a conductive material containing, for example, Cu in consideration of moderate hardness, resistance, a price, and the like.

Figure 7:
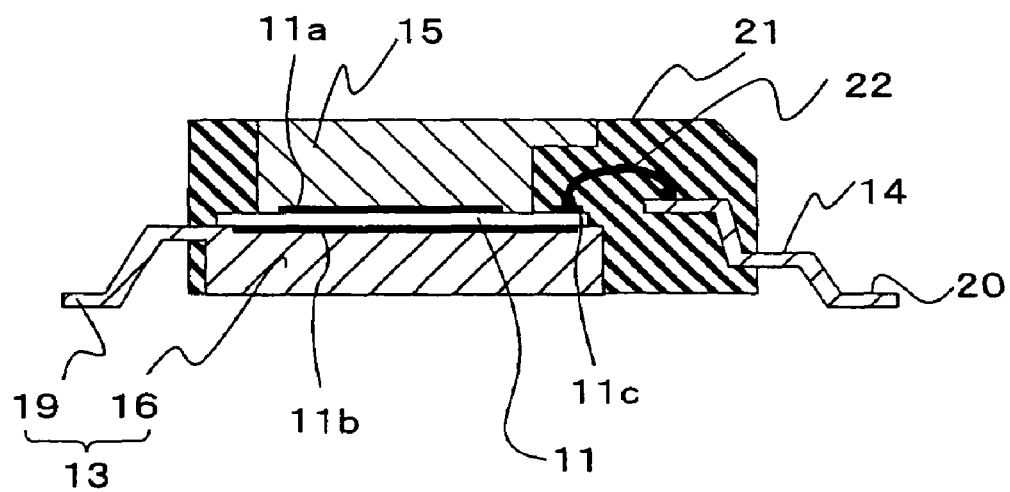
FIG. 7 is a cross-sectional view of a semiconductor device according to a third modification of the first embodiment of the present invention.

FIG. 7 shows the third modification. In this modification, the first heat sink portion 15 is extended over the gate wire 22 of the second modification of FIG. 6 and formed above the gate wire 22 with the sealing material (the housing 21) such as resin interposed therebetween. Since the first heat sink portion 15 is formed in such a manner, the area of the heat sink region can be enlarged. Thus, the thermal resistance can be further reduced.

In the second and third modifications of FIGS. 6 and 7, it is unnecessary to process and form the plate on the gate electrode. Accordingly, compared to the case that the top plate portion 17 is provided like FIGS. 2 and 5, it is easier to be manufactured by the methods of the second and third modifications. The gate electrode 11c is a control electrode and unnecessary to allow a large amount of current to flow therethrough compared to the source electrode 11a. Accordingly, an increase in electric resistance by the gate wire 22 is very small. Thus, in these modifications, the electric resistance and the thermal resistance can be reduced substantially the same as the example described in the first embodiment.

Figure 8:
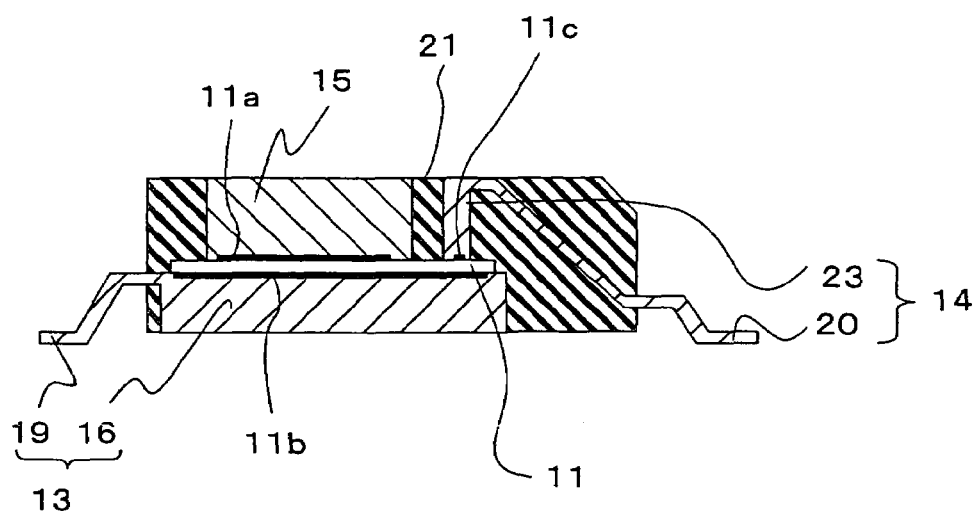
FIG. 8 is a cross-sectional view of a semiconductor device according to a fourth modification of the first embodiment of the present invention.

FIG. 8 shows the fourth modification. In this modification, instead of the top plate portion 17 of FIG. 2, a third heat sink portion 23 serving as the strap is formed. In FIG. 8, the third heat sink portion 23 serving as the strap is connected by direct contact to the gate electrode 11c, which is disposed on the first principal surface of the semiconductor device 11. The third heat sink portion 23 occupies one end portion of the third lead frame 14. The third terminal portion 20 occupies the other end portion of the third lead frame 14. The third heat sink portion 23 and the third terminal portion 20, which constitute the third lead frame 14, are integrated. The third lead frame 14 is composed of a conductive material containing, for example, Cu in consideration of moderate hardness, resistance, a price, and the like.

The third heat sink portion 23 serving as the strap is brought into direct contact with and press-contacted to the gate electrode 11c. The housing 21 is formed around the third heat sink portion 23 such that an upper surface of the third heat sink portion 23 is not covered with the housing. The housing 21 seals the semiconductor chip and the like by using resin or the like. The third heat sink portion 23 is covered with resin therearound and insulated from the first heat sink portion 15. The first and second heat sink portions 15 and 16 are thicker than the first and second terminal portions 18 and 19 in order to have sufficient heat sink effect.

According to the fourth modification described above, since the heat sink portion with the strap structure is formed on the gate electrode, the electric resistance and the thermal resistance can be further reduced.

In the first embodiment and the first to fourth modifications thereof described above, for the method of connecting the heat sink portions or the top plate portion to the electrodes on the semiconductor chip, the description has been made of press-contacting the heat sink portions or the top plate portion with the electrodes on the semiconductor chip directly from top and bottom as shown in FIGS. However, the connecting method maybe joining with solder or joining with a conductive adhesive. The method of directly press-contacting the heat sink portions or the top plate portion with the electrodes on the semiconductor chip does not use the solder, the conductive adhesive, or the like. The pressing method is preferred in that deterioration such as cracking caused in the vicinity of an interface by a difference in thermal expansion coefficient can be suppressed.

Furthermore, the package is not limited to the package having arrangements, shapes, and the like same as those of the lead frames described in the first embodiment and the first to fourth modifications thereof. The first to third lead frames 12, 13, and 14 have three, four, and one terminals, respectively. However, the numbers of terminals are determined by a configuration of inputs and outputs, applications, and the like of the semiconductor device and are not limited to the aforementioned numbers.

Figure 9:
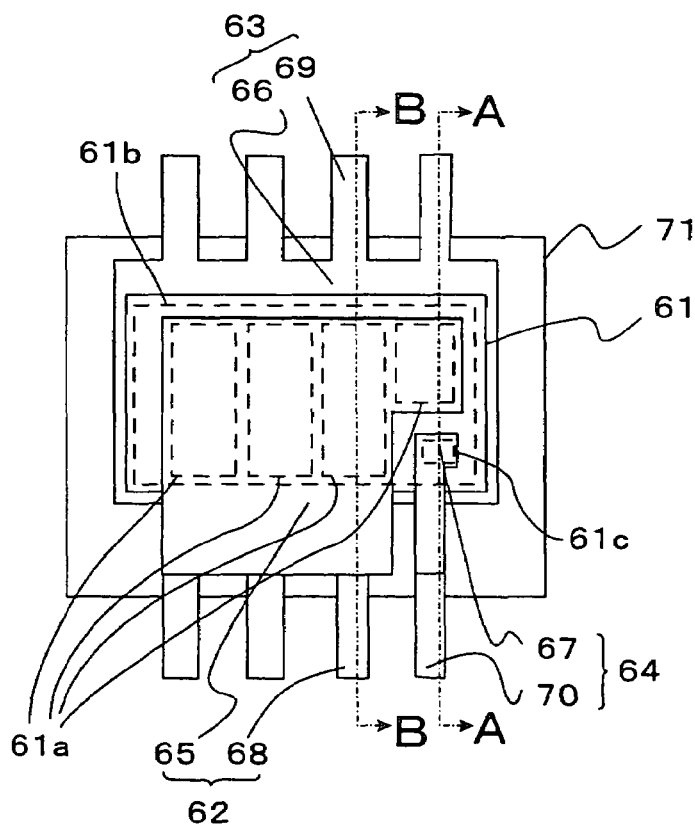
FIG. 9 is a plan view showing a semiconductor device according to a second embodiment of the present invention.
Figure 10:
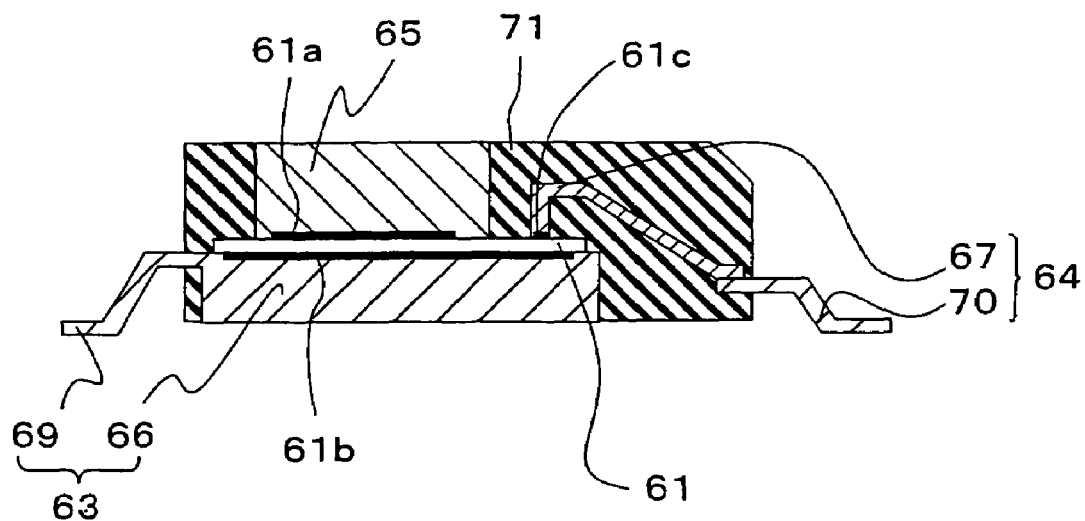
FIG. 10 is a cross-sectional view of the semiconductor device of FIG. 9 taken along a line A-A.
Figure 11:
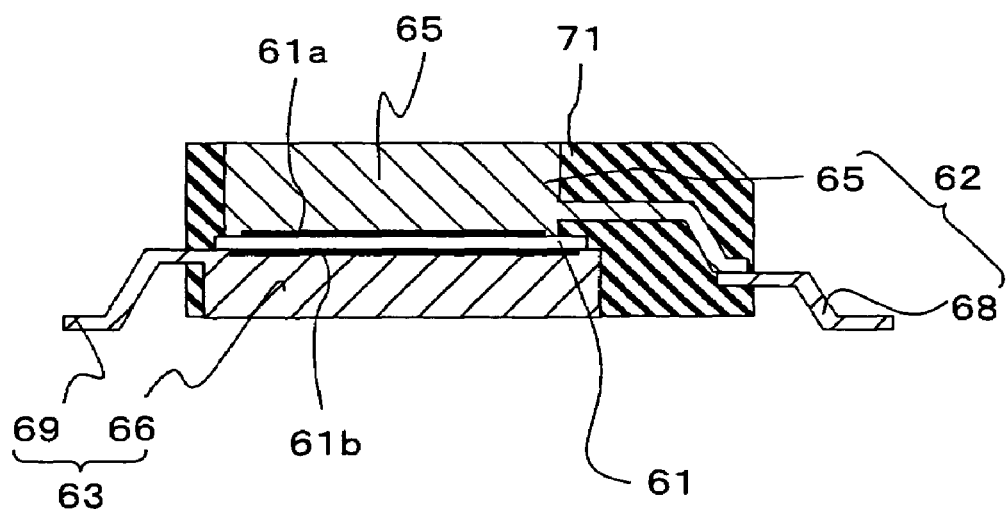
FIG. 11 is a cross-sectional view of the semiconductor device of FIG. 9 taken along a line B-B.

FIGS. 9 to 11 show a semiconductor device according to a second embodiment of the present invention. The same portions to those of the first embodiment shown in FIGS. 1 to 3 are given the same numbers.

FIG. 9 is a plan view of the semiconductor device according to the second embodiment. FIG. 10 is a cross-sectional view of the semiconductor device shown in FIG. 9 taken along a line A-A. FIG. 11 is a cross-sectional view of the semiconductor device shown in FIG. 9 taken along a line B-B.

A source electrode 61a and a gate electrode 61c are disposed on a first principal surface of a semiconductor chip 61 respectively. The source electrode 61a and the gate electrode 61c are connected to first and third lead frames 62 and 64, respectively. A drain electrode 61b, which is disposed on a second principal surface of the semiconductor chip 61, is connected to a second lead frame 63. The first and second lead frames 62 and 63 include first and second heat sink portions 65 and 66, respectively. The third lead frame 64 includes a top plate portion 67. The first to third lead frames 62, 63, and 64 include first to third terminal portions 68, 69, and 70, respectively. In the semiconductor chip 61, for example, a vertical MOSFET is formed.

As shown in FIG. 10, the top plate portion 67, which is a substantially board-shaped conductive plate, is connected to the gate electrode 61c. The gate electrode 61c is disposed on the first principal surface of the semiconductor chip 61. The top plate portion 67 is a component separate from the third terminal portion 70. The top plate portion 67 and the third terminal portion 70 are connected to each other to constitute the third lead frame 64. The gate electrode 61c and the top plate portion 67 are composed of a conductive material containing Al with a low resistance. The third terminal portion 70 is composed of a conductive material containing, for example, Cu in consideration of hardness.

The second heat sink portion 66 is connected to the drain electrode 61b, which is disposed on the second principal surface of the semiconductor chip 61. In the second heat sink portion 66, part of a surface is not covered with housing 71. The second heat sink portion 66 occupies one end portion of the second lead frame 63. The second terminal portion 69 occupies the other end portion of the second lead frame 63. The second heat sink portion 66 and the second terminal portion 69, which constitute the second lead frame 63, are unified. The second lead frame 63 is composed of a conductive material containing, for example, Cu in consideration of moderate hardness, resistance, a price, and the like.

As shown in FIG. 11, the first heat sink portion 65, which is a substantially board-shaped conductive plate, is connected to the source electrode 61a. The source electrode 61a is formed on the first principal surface of the semiconductor chip 61. The first heat sink portion 65 serves as the top plate portion and the heat sink portion. In the first heat sink portion 65, part of a surface is not covered with the housing. The first heat sink portion 65 is a component separate from the first terminal portion 68. The first heat sink portion 65 and the first terminal portion 68 are connected to each other to constitute the first lead frame 62. The source electrode 61a and the first heat sink portion 65 are composed of a conductive material containing Al with a low resistance. The first terminal portion 68 is composed of a conductive material containing, for example, Cu in consideration of hardness. The first heat sink portion 65 may be formed into an arch.

In order to have sufficient heat sink effect, the first and second heat sink portions 65 and 66 are thicker than the first and second terminal portions 68 and 69. The semiconductor chip 61 is directly sandwiched between the first heat sink portion 65 and the second heat sink portion 66.

The first heat sink portion 65 is brought into direct contact with the first principal surface of the semiconductor chip 61 and an ultrasonic bonding operation is performed. Thus, the first heat sink portion 65 is connected to the source electrode 61a. The second heat sink portion 66 is brought into direct contact with the second principal surface of the semiconductor chip 61 and is press-contacted therewith to be joined. Thus, the second heat sink portion 66 is connected to the drain electrode 61b. A housing 71 is formed around the first heat sink portion 65 connected to the semiconductor chip 61 such that an upper surface of the first heat sink portion 65 is exposed. The housing 71 is formed around the second heat sink portion 66 as well such that a lower surface of the second heat sink portion 66 is exposed. The housing 71 seals the semiconductor chip and the like by using resin or the like.

As shown in FIG. 10, the top plate portion 67, which is connected to the gate electrode 61c, is covered with resin or the like and insulated from the first heat sink portion 65.

According to the second embodiment, the upper surface of the first heat sink portion 65 and the lower surface of the second heat sink portion 66 are not covered with resin of the housing and exposed to the outside. Accordingly, heat generated from the semiconductor chip 61 can be directly released to the outside of the housing. Therefore, since the first heat sink portion 65, which is formed on the source electrode 61a, has a structure serving as the strap and can efficiently release the heat from the semiconductor chip to the outside. As a result, the thermal resistance and the electric resistance can be reduced. Moreover, since the top plate portion 67 is formed on the gate electrode 61c as the conductive plate with the strap structure, the electric resistance can be further reduced.

Since each heat sink portion and the corresponding electrode are composed of the same conductive material, the thermal resistance is low at the interface of connection, thus further increasing the heat release efficiency.

Since heat can be released from both of the upper surface of the first heat sink portion 65 and the lower surface of the second heat sink portion 66, namely, from each principal surface side, the heat release efficiency is good. Therefore, the deformation of the semiconductor chip, such as warpage, caused by the temperature difference between each principal surface side or the like can be suppressed. Moreover, an operating range of the semiconductor device can be extended.

Surface areas of the heat sink portions exposed to the outside can be used as part of terminals.

Next, a description will be given of modifications of the above-described second embodiment of the present invention. In FIGS. 12 to 16 showing these modifications, the same portions to those of the second embodiment given the same numbers.

Figure 12:
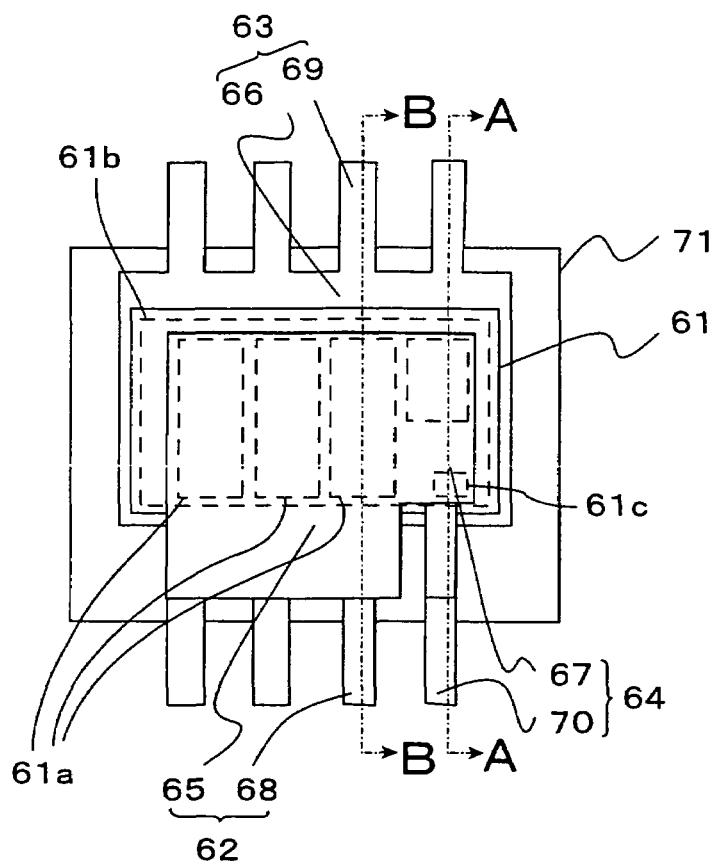
FIG. 12 is a plan view showing a semiconductor device according to a first modification of the second embodiment of the present invention.
Figure 13:
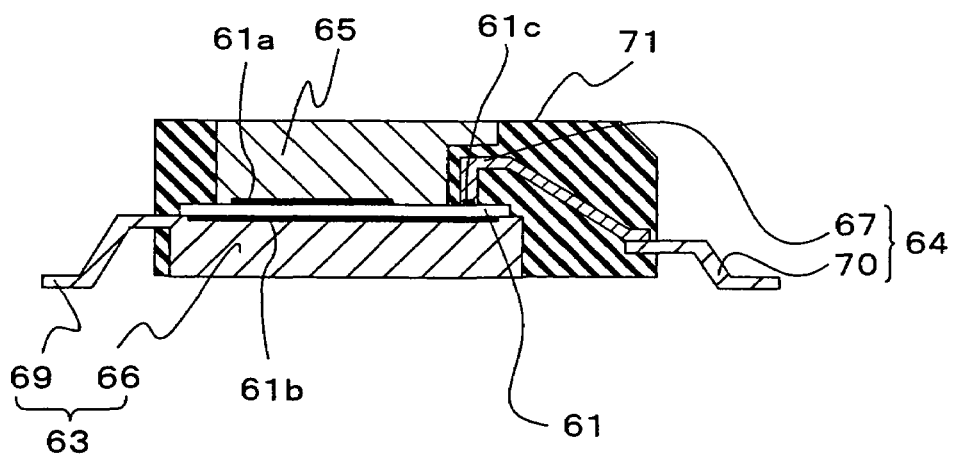
FIG. 13 is a cross-sectional view of the semiconductor device of FIG. 12 taken along a line A-A.

FIGS. 12 and 13 show the first modification. In this modification, the first heat sink portion 65 is extended over the top plate portion 67 and formed above the top plate portion 67 with a sealing material such as resin interposed therebetween. Since the first heat sink portion 65 is formed in such a manner, an area of the heat sink region can be enlarged, so that the thermal resistance can be further reduced.

Figure 14:
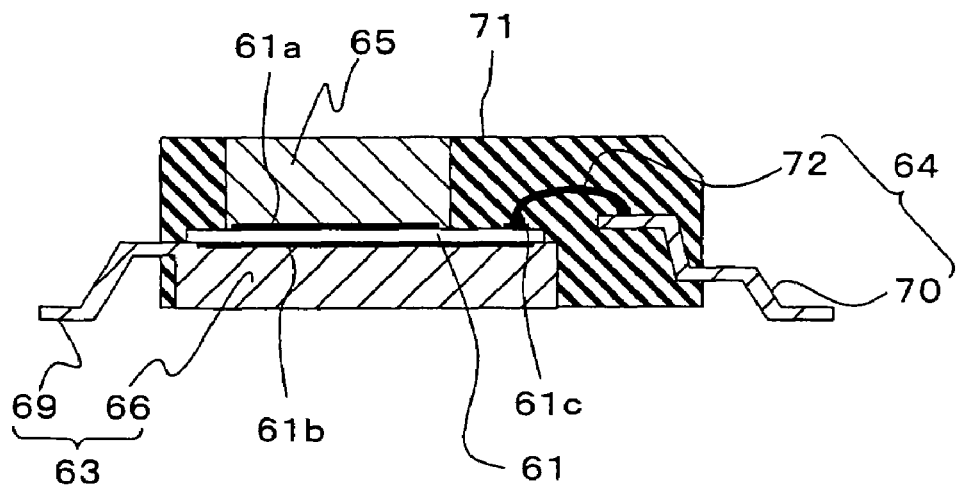
FIG. 14 is a cross-sectional view of a semiconductor device according to a second modification of the second embodiment of the present invention.

FIG. 14 shows the second modification. In this modification, instead of the top plate portion 67 of FIG. 10, a gate wire 72 is connected by bonding on the gate electrode 61c, which is disposed on the first principal surface of the semiconductor chip 61. The gate electrode 61c is connected to the third terminal portion 69 of the third lead frame 64 through this gate wire 72. The gate wire 72 can be composed of, for example, gold. The third terminal portion 70 is composed of a conductive material containing, for example, Cu in consideration of moderate hardness, resistance, a price, and the like.

Figure 15:
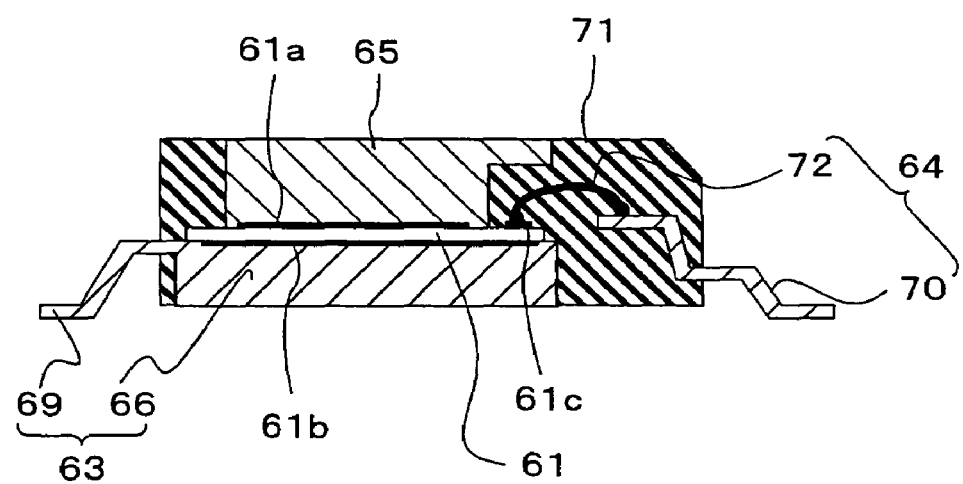
FIG. 15 is a cross-sectional view of a semiconductor device according to a third modification of the second embodiment of the present invention.

FIG. 15 shows the third modification. In this modification, the first heat sink portion 65 is extended over the gate wire 72 of the second modification of FIG. 14 and formed above the gate wire 72 with the sealing material such as resin interposed therebetween. Since the first heat sink portion 65 is formed in such a manner, the area of the heat sink region can be enlarged, so that the thermal resistance can be further reduced.

In the second and third modifications of FIGS. 14 and 15, it is unnecessary to process and form the plate on the gate electrode. Accordingly, compared to the case that the top plate portion 67 is provided as shown in FIGS. 10 and 13, it is easier to be manufactured by the methods of the second and third modifications. The gate electrode 61c is the control electrode and unnecessary to allow a large amount of current to flow therethrough compared to the source electrode 61a. Accordingly, an increase in electric resistance due to the gate wire 72 is very small. Consequently, in these modifications, the electric resistance and the thermal resistance can be reduced substantially the same as the example described in the second embodiment.

Figure 16:
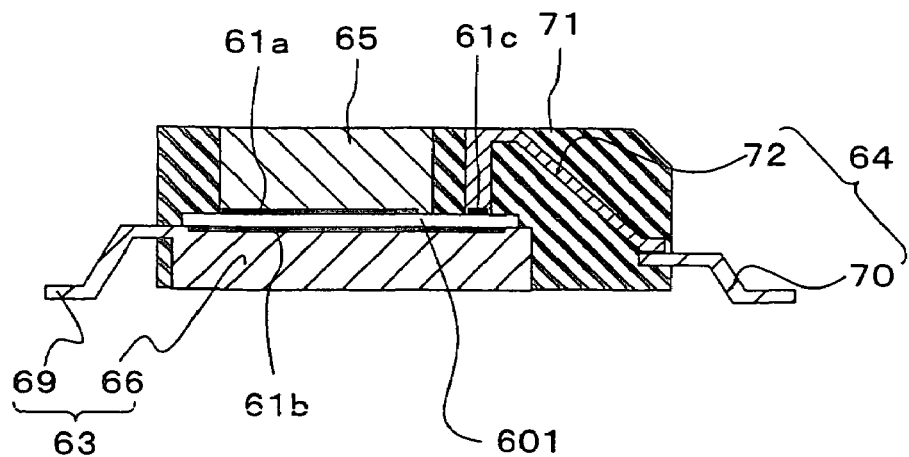
FIG. 16 is a cross-sectional view of a semiconductor device according to a fourth modification of the second embodiment of the present invention.

FIG. 16 shows the fourth modification. In this modification, instead of the top plate portion 67 of FIG. 10, a third heat sink portion 73 serving as the strap is formed. In FIG. 16, the third heat sink portion 73 serving as the strap is connected by direct contact to the gate electrode 61c, which is disposed on the first principal surface of the semiconductor device 61. The third heat sink portion 73 is a component separate from the third terminal portion 70. The third heat sink portion 73 and the third terminal portion 70 are connected to each other to constitute the third lead frame 64. The gate electrode and the third heat sink portion 73 are composed of a conductive material containing Al with a low resistance. The third terminal portion 70 is composed of a conductive material containing, for example, Cu in consideration of moderate hardness, resistance, a price, and the like.

The third heat sink portion 73 serving as the strap is brought into direct contact with the principal surface of the semiconductor chip 61 and an ultrasonic bonding operation is performed. Thus, the third heat sink portion 73 is connected to the gate electrode 61c. The housing 71 is formed around the third heat sink portion 73 such that an upper surface of the third heat sink portion 73 is not covered with the housing. The housing 71 seals the semiconductor chip and the like using resin or the like. The third heat sink portion 73 is covered with resin therearound and insulated from the first heat sink portion 65. The first and second heat sink portions 65 and 66 are thicker than the first and second terminal portions 68 and 69 in order to have sufficient heat sink effect.

According to the fourth modification described above, since the heat sink portion of the strap structure is formed on the gate electrode, the electric resistance and the thermal resistance can be further reduced. Furthermore, since each of the first and second heat sink portions is formed so as to include the conductive material same as that of the corresponding electrode, the heat release efficiency can be further improved.

In the second embodiment and the first to fourth modifications thereof described above, for the method of connecting the heat sink portions or the top plate portion to the electrodes on the semiconductor chip, the description has been given of the press-contacting and the ultrasonic bonding by direct contact from top and bottom as shown in FIGS. However, the connecting method may be joining with solder or joining with a conductive adhesive. Since the direct press-contacting does not use the solder, the conductive adhesive, or the like, direct press-contacting is preferred in that deterioration such as cracking caused in the vicinity of the interface by a difference in thermal expansion coefficient can be suppressed.

Furthermore, the package is not limited to the package having arrangements, shapes, and the like same as those of the lead frames described in the second embodiment and the first to fourth modifications thereof. The first to third lead frames 62, 63, and 64 have three, four, and one terminals, respectively. However, these numbers of terminals are determined by the configuration of inputs and outputs, applications, and the like of the semiconductor device and are not limited to the aforementioned numbers.

In the above-described first and second embodiments, the description has been given taking the vertical MOSFET as an example of the semiconductor element incorporated in the semiconductor package, but the present invention can be applied to a diode including first and second principal surfaces and electrodes provided on the principal surfaces. In this case, a structure can be conceived in which the gate electrodes 11c and 61c and the third lead frames 14 and 64 are eliminated from FIGS. 1 and 9, respectively. The semiconductor element is not limited to the MOSFET and may be, in addition to the diode, an insulated gate bipolar transistor (IGBT), an injection enhanced gate transistor (IEGT), a MOS controlled thyristor (MCT), a gate turn off thyristor (GTO), or the like.

Figure 17:
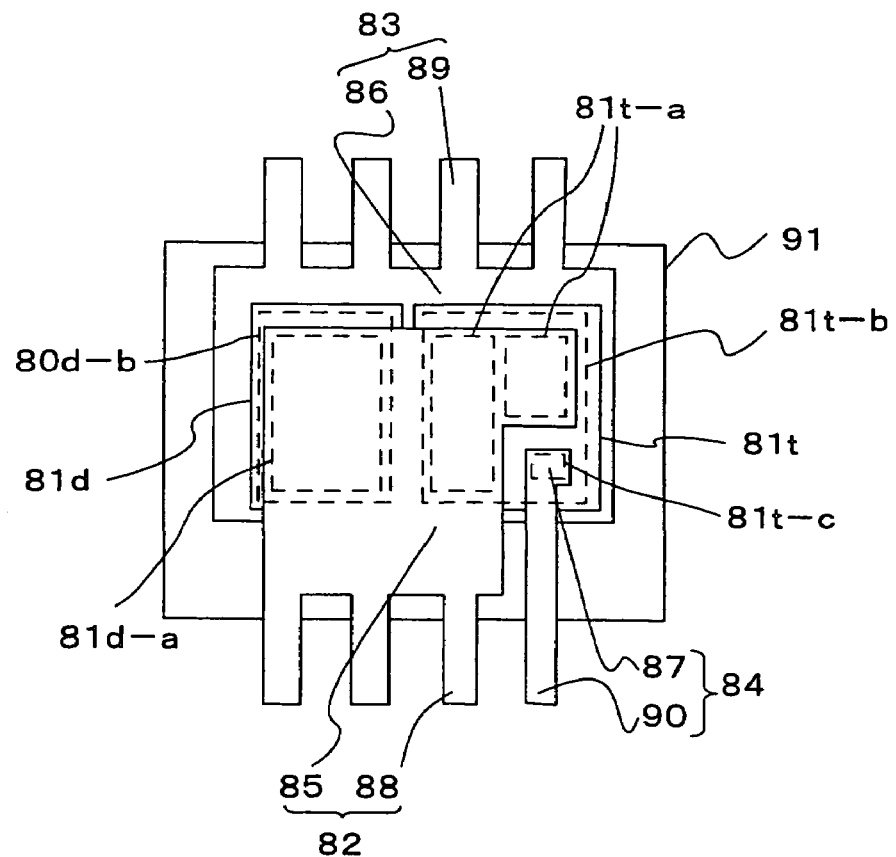
FIG. 17 is a plan view of a semiconductor device according to a third embodiment of the present invention.

FIG. 17 shows a semiconductor device according to a third embodiment of the present invention. FIG. 17 is a plan view of the semiconductor device.

A vertical transistor and a diode are formed in semiconductor chips 81t and 81d, respectively. Electrodes 81t-a and 81d-a, which are respectively disposed on the first principal surfaces of the semiconductor chips 81t and 81d, are connected to a first lead frame 82. Electrodes 81t-b and 81d-b, which are respectively disposed on the second principal surfaces of the semiconductor chips 81t and 81d, are connected to a second lead frame 83. An electrode 81t-c, which is disposed on the first principal surface of the semiconductor chip 81t, is connected to a third lead frame 84. The first and second lead frames 82 and 83 include first and second heat sink portions 85 and 86, respectively. The third lead frame 84 includes a top plate portion 87. The first to third lead frames 82, 83, and 84 include first to third terminal portions 88, 89, and 90, respectively. The combination of the semiconductor elements is not limited to that of the vertical transistor and the diode. The elements can be arbitrarily selected and combined from MOSFETs, IGBTs, IEGTs, MCTs, GTOs, diodes, and the like. Therefore, the present invention can be applied to the case where the plurality of semiconductor chips are mounted in the semiconductor package.

Figure 18:
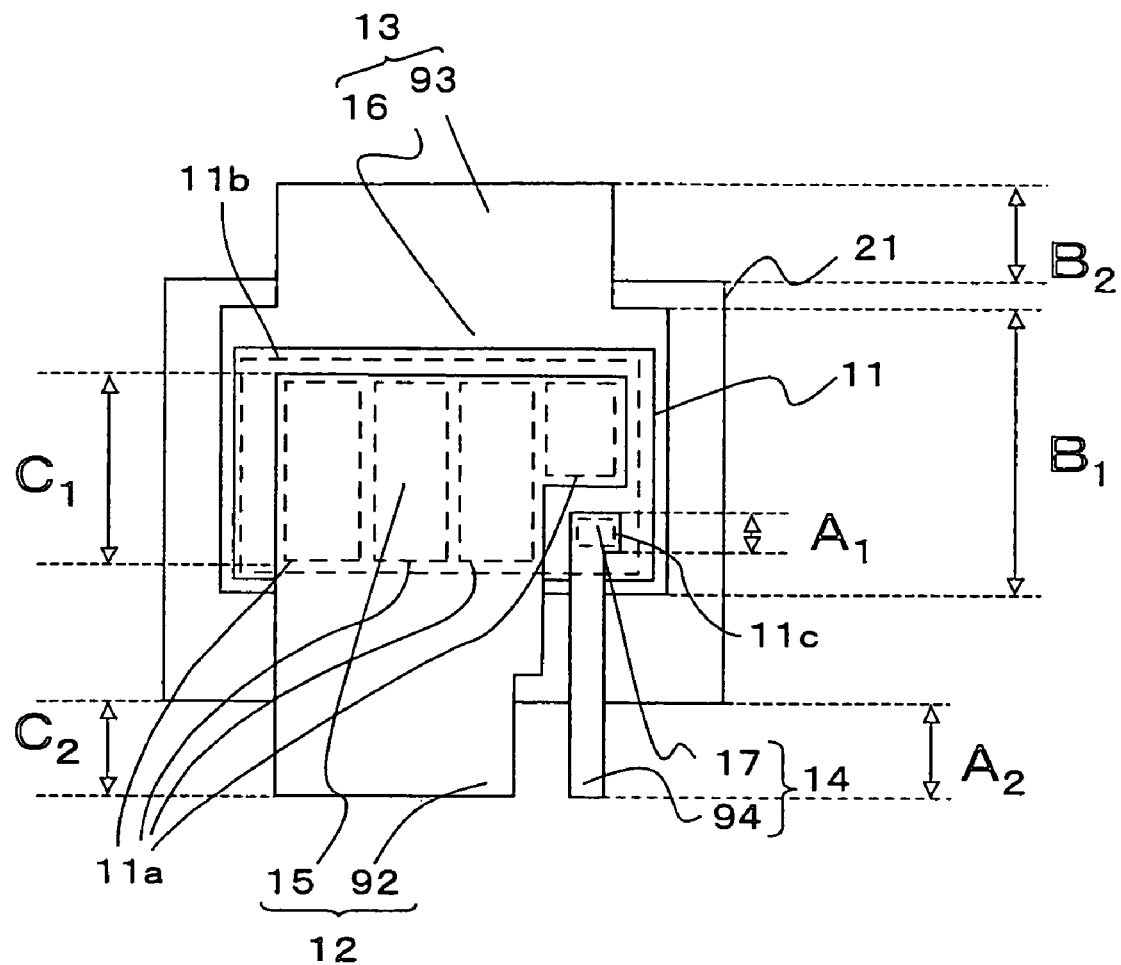
FIG. 18 is a plan view showing a semiconductor device according to another modification of the first to third embodiment of the present invention.
Figure 19:
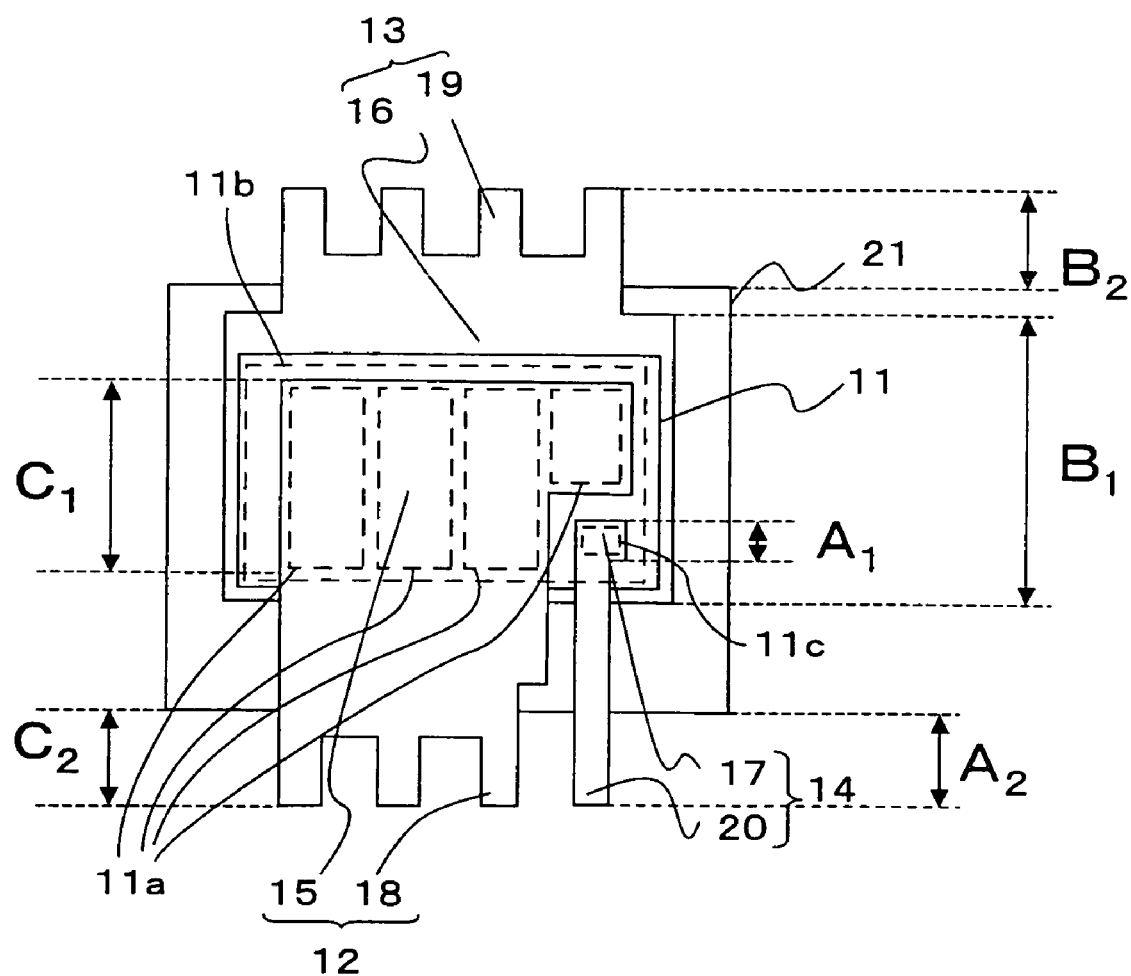
FIG. 19 is a plan view showing a semiconductor device according to another modification of the first to third embodiment of the present invention.

In the above-described first to third embodiments and the embodiments shown by the modifications thereof, the first to third lead frames have three, four, and one terminals, respectively. However, the numbers of terminals are determined by configuration of inputs and output, applications, and the like of the semiconductor device and are not limited to the aforementioned numbers. As shown in FIG. 18, instead of the first to third terminal portions 18, 19, and 20 of FIG. 1, first to third terminal portions 92, 93, and 94 are formed. The first to third terminal portions 92, 93, and 94 have one terminal, respectively. And as shown in FIG. 19, the root portions of the terminals of the first and second lead frames 12 and 13 which have plural terminals may be exposed to the outside of the housing 21.

Furthermore, the description has been given taking as an example the strap structure in which the heat sink portion serving as the strap is formed on the electrode such as the source electrode and the electrode is connected to the lead frame through the heat sink portion. However, the present invention is not limited to the strap structure. Moreover, instead of the heat sink portion, a plate-shaped connecting portion with a low thermal resistance may be formed on the electrode such as the source electrode. And part of a surface of the plate-shaped connecting portion is not covered with the housing. A plane shape of the plate-shaped connecting portion is not particularly limited. In the plate-shaped connecting portion, concave portions and the like may be formed on part of an exposed surface thereof, or wiring for connecting another electrode may be formed on part of the exposed surface thereof. Moreover, part of the upper surface (or lower surface) of each heat sink portion or part of the upper surface (or lower surface) of each connecting portion may be covered with the housing. The part of the surface of each heat sink portion or each connecting portion which is not covered wit the housing is not limited to the upper surface (or lower surface) and may include side faces.

The description has been given taking as an example the structure of the lead frames including the heat sink portion on one end and the terminal portion on the other end, but not limited thereto. The present invention may be applied to the semiconductor package of a structure of the lead frame in which a plurality of terminal portions extends from the heat sink portions.

Numerous modifications and variations of the present invention are possible in light of the above teachings. It is therefore to be understood that, within the scope of the appended claims, the present invention can be practiced in a manner other than as specifically described herein.

What is claimed is:

1. A semiconductor device comprising:
   a semiconductor chip including first and second principal surfaces, a first electrode formed on the first principal surface, and a second electrode formed on the second principal surface;
   a first conductive lead frame including a first heat sink portion connected to the first electrode and a first terminal portion in which the first sink portion entirely covers the first electrode and is unified with the first terminal portion;
   a second conductive lead frame including a second heat sink portion connected to the second electrode and a second terminal portion in which the second heat sink portion entirely covers the second electrode and is unified with the second terminal portion;

a housing which is provided with front, side and rear surfaces to hold the semiconductor chip and is formed not to cover part of surfaces of the first and second heat sink portions in order to expose the first and second heat sink portions from the front and rear surfaces of the housing, respectively;

a third electrode on the first principal surface; and a third lead frame including a top plate portion connected to the third electrode and a third terminal portion.

2. The semiconductor device according to claim 1, wherein the first and second electrodes are directly connected to the first and second heat sink portions, respectively.

3. The semiconductor device according to claim 1, wherein the first and second heat sink portions are composed of conductive plates.

4. The semiconductor device according to claim 1, wherein thicknesses of the first and second heat sink portions are greater than thicknesses of the first and second terminal portions, respectively.

5. The semiconductor device according to claim 1, wherein the first and the second heat sink portions and the first and second terminal portions are composed of conductive materials containing Cu.

6. The semiconductor device according to claim 1, wherein the first heat sink portion is formed to extend into a region above the third electrode.

7. The semiconductor device according to claim 1, wherein the top plate portion and the third terminal portion are composed of a conductive material containing Cu.

8. The semiconductor device according to claim 1, wherein the first heat sink portion and the first terminal portion are separated from each other and are connected to each other to constitute the first conductive lead frame.

9. A semiconductor device comprising:

a semiconductor chip including first and second principal surfaces, a first electrode formed on the first principal surface, and a second electrode formed on the second principal surface;

a first conductive lead frame including a first connecting portion connected to the first electrode and a first terminal portion in which the first connecting portion is plate-shaped and the first connecting portion entirely covers the first electrode and is unified with the first terminal portion;

a second conductive lead frame including a second connecting portion connected to the second electrode and a second terminal portion in which the second connecting portion is plate-shaped and the second connecting portion entirely covers the second electrode and is unified with the second terminal portion;

a housing having front, side and rear surfaces to seal the semiconductor chip, and being formed not to cover part of surfaces of the first and second connecting portions in order to expose the first and second connecting portions from the front and rear surfaces of the housing, respectively;

a third electrode on the first principal surface; and a third lead frame including a top plate portion connected to the third electrode and a third terminal portion.

10. The semiconductor device according to claim 9, wherein the first and second terminal portions are unified with the first and second connecting portions from which the first and second terminal portions extend, respectively.

11. The semiconductor device according to claim 9, wherein the first and second electrodes are directly connected to the first and second connecting portions, respectively.

12. The semiconductor device according to claim 9, wherein thicknesses of the first and second connecting portions are greater than thicknesses of the first and second terminal portions, respectively.

13. The semiconductor device according to claim 9, wherein the first and second connecting portions and the first and second terminal portions are composed of conductive materials containing Cu.

14. The semiconductor device according to claim 9, wherein the first connecting portion is formed to extend into a region above the third electrode.

15. The semiconductor device according to claim 9, wherein the top plate portion and the third terminal portion are composed of a conductive material containing Cu.

16. The semiconductor device according to claim 9, further comprising:

a third electrode on the first principal surface, wherein the first connecting portion is formed to extend into a region above the third electrode.

17. A semiconductor device comprising:

a semiconductor chip including first and second principal surfaces, a first electrode formed on the first principal surface, and a second electrode formed on the second principal surface;

a first conductive lead frame including a first heat sink portion connected to the first electrode and a first terminal portion in which the first heat sink portion entirely covers the first electrode and is unified with the first terminal portion;

a second conductive lead frame including a second heat sink portion connected to the second electrode and a second terminal portion in which the second heat sink portion entirely covers the second electrode and is unified with the second terminal portion;

a housing which is provided with front side and rear surfaces to hold the semiconductor chip and is formed not to cover part of surfaces of the first and second heat sink portions in order to expose the first and second heat sink portions from the front and rear surfaces of the housing, respectively;

a third electrode on the first principal surface, wherein the first heat sink portion is formed to extend into a region above the third electrode.

* * * * *